[12] United States Patent  
Fan

(10) Patent No.: US 9,991,248 B2  
(45) Date of Patent: Jun. 5, 2018

(54) METHOD AND DEVICE OF POP STACKING FOR PREVENTING BRIDGING OF INTERPOSER SOLDER BALLS

(71) Applicant: POWERTECH TECHNOLOGY INC., Hsinchu County (TW)

(72) Inventor: Wen-Jeng Fan, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 11 days.

(21) Appl. No.: 15/393,264

(22) Filed: Dec. 29, 2016

(65) Prior Publication Data  
US 2018/0019235 A1 Jan. 18, 2018

(30) Foreign Application Priority Data  
Jul. 13, 2016 (TW) .............................. 105122119 A

(51) Int. Cl.  
*H01L 25/00* (2006.01)  
*H01L 25/10* (2006.01)  
*H01L 21/50* (2006.01)

(52) U.S. Cl.  
CPC .............. *H01L 25/50* (2013.01); *H01L 21/50* (2013.01); *H01L 25/105* (2013.01); *H01L 2225/1023* (2013.01); *H01L 2225/1041* (2013.01); *H01L 2225/1058* (2013.01)

(58) Field of Classification Search  
CPC ....... H01L 25/50; H01L 21/50; H01L 25/105; H01L 2225/1058; H01L 2225/1041; H01L 2225/1023; H01L 25/117  
See application file for complete search history.

(56) References Cited

U.S. PATENT DOCUMENTS

| | | | | |
|---|---|---|---|---|
| 6,653,170 B1* | 11/2003 | Lin | ........................ | H01L 21/563 257/E21.503 |
| 2004/0023543 A1* | 2/2004 | Murr | ................... | H01R 12/7076 439/342 |
| 2010/0025837 A1* | 2/2010 | Shinoda | .............. | H01L 25/0657 257/686 |
| 2011/0306168 A1* | 12/2011 | Pendse | .................... | H01L 21/56 438/118 |
| 2013/0127029 A1* | 5/2013 | Lee | ................... | H01L 23/49503 257/675 |

\* cited by examiner

*Primary Examiner* — Roy Potter  
*Assistant Examiner* — Paul Patton  
(74) *Attorney, Agent, or Firm* — Winston Hsu

(57) ABSTRACT

A first semiconductor package of a POP structure has a first body and a plurality of first solder balls. A second semiconductor package of the POP structure has a second body and a plurality of second solder balls. A stand-off mechanism is utilized to maintain a minimum gap between the first body and the second body while a reflow soldering process is performed. By performing the reflow soldering process, the first solder balls and the second solder balls are heated and engaging with one another so as to solder the first solder balls and the second solder balls to form a plurality of interposer solder balls. Each interposer solder ball has a height substantially equal to the minimum gap and a cross sectional width less than a pitch between two adjacent interposer solder balls. Thereby, the POP structure would be a fine pitch package.

18 Claims, 5 Drawing Sheets

METHOD AND DEVICE OF POP STACKING FOR PREVENTING BRIDGING OF INTERPOSER SOLDER BALLS

CROSS-REFERENCE TO RELATED APPLICATIONS

This application claims the benefit of Taiwan Patent Application No. 105122119, filed 2016 Jul. 13, and included herein by reference.

BACKGROUND OF THE INVENTION

1. Field of the Invention

The present invention relates to a field of packaging semiconductor dies, and more particularly to a method and device of package-on-package (POP) stacking for preventing bridging of interposer solder balls.

2. Description of the Prior Art

In the field of modern semiconductor packaging technology, in order to implement multifunctions and reduce the area of the package, package-on-package (POP) is developed. A POP structure includes two or more independent packages which have been separately packaged and tested. The two or more independent packages are stacked together through surface mount to form a highly integrated device without occupying additional surface area. Such an approach is particularly applicable to integrate logic and memories.

FIG. 1 is a cross-sectional diagram of a package-on-package (POP) structure 100 according to the prior art. FIG. 2 is a cross-sectional diagram illustrating the assembling process of the POP structure 100. The conventional POP structure 100 comprises a bottom package 110 and an upper package 120. As shown in FIG. 2, before the POP structure 100 is completely assembled, the bottom package 110 comprises a first die 115 and a plurality of first solder balls 113 disposed on an upper surface of a first substrate 111, and a plurality of terminals 118 disposed on a bottom surface of the first substrate 111. The upper package 120 comprises at least a second die 126 disposed on an upper surface of a second substrate 125, and a plurality of second solder balls 123 disposed on a bottom surface of the second substrate 125. As shown in FIGS. 1 and 2, during a reflow soldering process, the second solder balls 123 are moved towards respective first solder balls 113, and the second solder balls 123 and the respective first solder balls 113 are melted and integrated into a plurality of interposer solder balls 130. Due to the surface tension among the solder balls and the weight of the upper package 120, the gap between the upper package 120 and the bottom package 110 is reduced, expanding the interposer solder balls 130 sidewards. As shown in FIG. 1, the excessive sideward expansion of the interposer solder balls 130 creates bridges between the interposer solder balls 130, which short circuited the POP structure 100, reducing the yield of the POP structure 100.

SUMMARY OF THE INVENTION

An embodiment of the present invention provides a method of package-on-package (POP) stacking. The method comprises providing a first semiconductor package, the first semiconductor package having a first body, and a plurality of first solder balls disposed on an upper surface of the first body; providing a second semiconductor package, the second semiconductor package having a second body, and a plurality of second solder balls disposed on a bottom surface of the second body; performing a pick-and-drop positioning process, comprising disposing the second semiconductor package onto the first semiconductor package so as to move the second solder balls towards the first solder balls; and performing a reflow soldering process on the first body and the second body, the reflow soldering process comprising using a stand-off mechanism to control a minimum vertical gap between the first body and the second body and heating the first solder balls and the second solder balls to solder the first solder balls and the second solder balls to each other and form a plurality of interposer solder balls, each of the plurality of interposer solder balls having a height substantially equal to the minimum vertical gap and a cross sectional width less than a pitch between two adjacent interposer solder balls of the plurality of interposer solder balls.

Another embodiment of the present invention discloses a package-on-package (POP) structure. The POP structure comprises a first semiconductor package, a second semiconductor package and a plurality of interposer solder balls. The first semiconductor package has a first body. The second semiconductor package is disposed on the first semiconductor package and has a second body. The interposer solder balls are formed between the first body and the second body. Each of the interposer solder balls has a cross sectional width less than a pitch between two adjacent interposer solder balls of the plurality of interposer solder balls.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
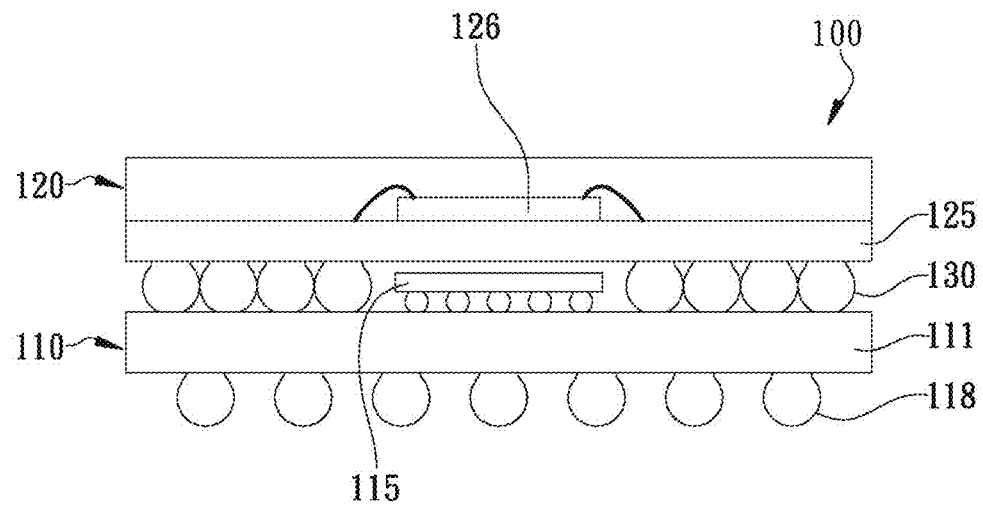
FIG. 1 is a cross-sectional diagram of a package-on-package (POP) structure according to the prior art.
Figure 2:
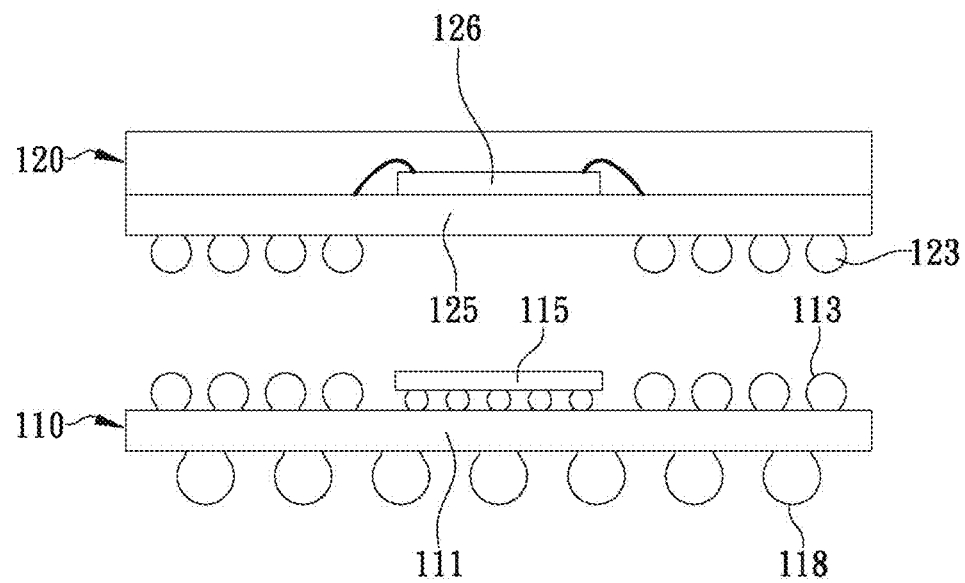
FIG. 2 is a cross-sectional diagram illustrating the assembling process of the POP structure shown in FIG. 1.

With reference to the attached drawings, the present invention is described by means of the embodiment (s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to a first embodiment of the present invention, a method of package-on-package (POP) stacking for preventing bridging of interposer solder balls is illustrated in FIGS. 3A to 3E for a cross-sectional view. FIG. 4 is an enlarged diagram of the interposer solder balls of the POP structure according to the first embodiment of the present invention. The method according to the first embodiment comprises a plurality of processing steps, and each of the processing steps is described with a respective diagram of the component cross-sectional views illustrated in FIGS. 3A to 3E.

First, a first semiconductor package 210 is provided to be used as a bottom package of the POP structure. The first semiconductor package 210 comprises a first body 211. The first body 211 may have an upper surface 212 and a bottom surface 214. A plurality of first solder balls 213 are formed on the upper surface 212 of the first body 211. The first solder balls 213 may be made of tin-lead alloy or lead-free solder. In an embodiment of the present invention, the first semiconductor package 210 may be a flip-chip package. The first body 211 comprises a first substrate. The first substrate may be a micro printed circuit board, a micro ceramic circuit board, an integrated circuit (IC) chip carrier or a pre-molded circuit substrate. A first die 215 of the first semiconductor package 210 is bonded on the upper surface 212 of the first body 211. A plurality of bumps 216 may be formed under the first die 215 for electrically connecting the first die 215 to the first body 211. A plurality of terminals 218 (e.g., solder balls) are formed on the bottom surface 214 of the first body 211 for electrically connecting the first body 211 to an outside printed circuit board. In the embodiment, the first body 211 may comprise a plurality of first solder pads 217. The first solder balls 213 may longitudinally be corresponding to the first solder pads 217 and may be formed on the first solder pads 217.

Figure 3A:
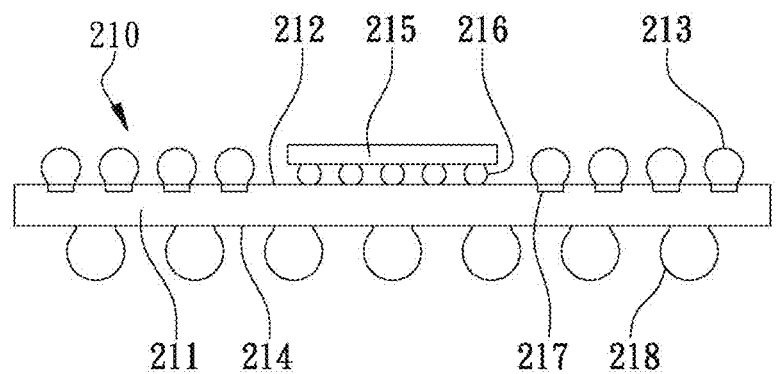
FIGS. 3A to 3E are component cross-sectional views showing each processing step of a method of package-on-package (POP) stacking according to a first embodiment of the present invention.
Figure 3B:
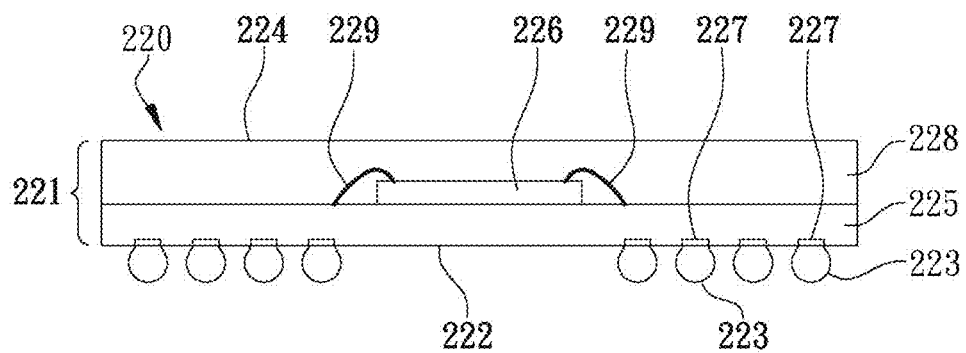
Figure 4:
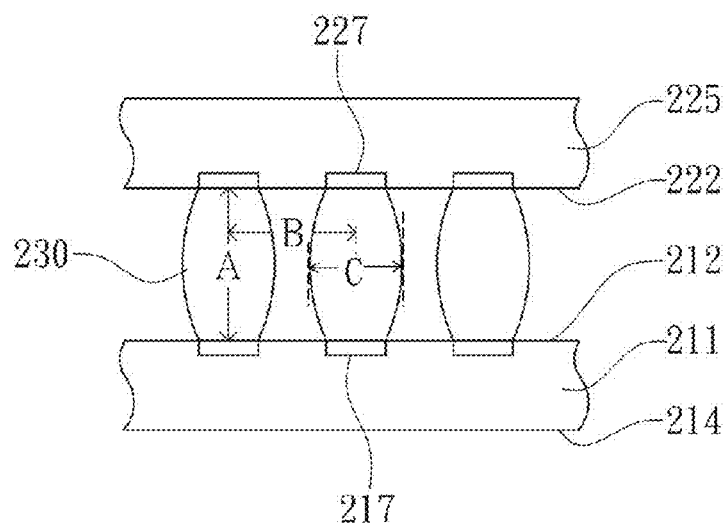
FIG. 4 is an enlarged diagram of the interposer solder balls of the POP structure according to the first embodiment of the present invention.

Afterward, as shown in FIG. 3B, a second semiconductor package 220 is provided and used as an upper package of the POP structure. The second semiconductor package 220 comprises a second body 221, and the second body 221 has a bottom surface 222 and an upper surface 224. A plurality of second solder balls 223 are formed on the bottom surface 222 of the second body 221. The second solder balls 223 may be made of tin-lead alloy or lead-free solder. In an embodiment of the present invention, the second body 221 further comprises a mold 228 and a second die 226 encapsulated in the mold 228. In an embodiment of the present invention, the second body 221 may further comprise a second substrate 225. The second die 226 may be disposed on the second substrate 225 and electrically connected to the second substrate 225 via a plurality of bonding wires. The mold 228 is formed on the second substrate 225 to encapsulate the second die 226. In the embodiment, the second body 221 may comprise a plurality of second solder pads 227, and the second solder balls 223 are longitudinally corresponding to the second solder pads 227 and formed on the second solder pads 227.

Figure 3C:
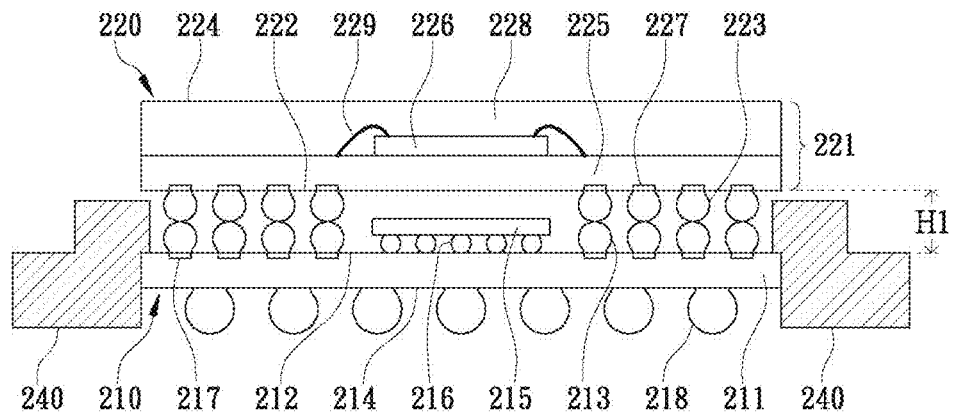

Subsequently, a pick-and-drop positioning process is performed, as shown in FIG. 3C. During the pick-and-drop positioning process, the second semiconductor package 220 is disposed onto the first semiconductor package 210 so as to move the second solder balls 223 towards the first solder balls 213. When the second solder balls 223 contact the first solder balls 213, a vertical gap between the first body 211 and the second body 221 is H1. The vertical gap H1 may be substantially equal to a sum of the height of the second solder balls 223 and the height of the first solder balls 213. A stand-off mechanism 240 may be placed adjacent to an edge area of the first semiconductor package 210 in advance.

Figure 3D:
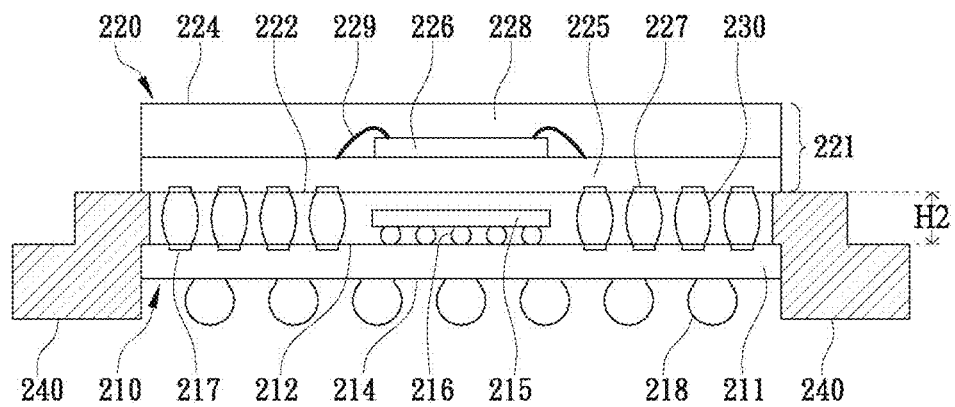

Next, a reflow soldering process is performed, as shown in FIG. 3D. During the reflow soldering process, the first solder balls 213 and the second solder balls 223 are heated, such that the first solder balls 213 and the second solder balls 223 are engaging with one another so as to solder the first solder balls 213 and the second solder balls 223 to form a plurality of interposer solder balls 230 which will electrically connect the first body 211 with the second body 221. When the reflow soldering process is performed. The stand-off mechanism 240 is utilized to maintain a minimum vertical gap H2 between the first body 211 and the second body 221. After performing the reflow soldering process, a vertical gap between the first body 211 and the second body 221 may be substantially equal to the minimum vertical gap H2. Wherein, the minimum vertical gap H2 is less than the vertical gap H1.

In an embodiment of the present invention, the stand-off mechanism 240 may comprise a support bracket. The support bracket may be a demountable annular support bracket. At least a portion of the support bracket may be disposed between the edge of the first body 211 and the edge of the second body 221 so as to separate the first body 211 and the second body 221 by at least the minimum vertical gap H2 during the reflow soldering process. With the help of the stand-off mechanism 240, bridging of the interposer solder balls 230 may be prevented and deformation of the second semiconductor package 220 may be reduced when the reflow soldering process is performed.

Figure 3E:
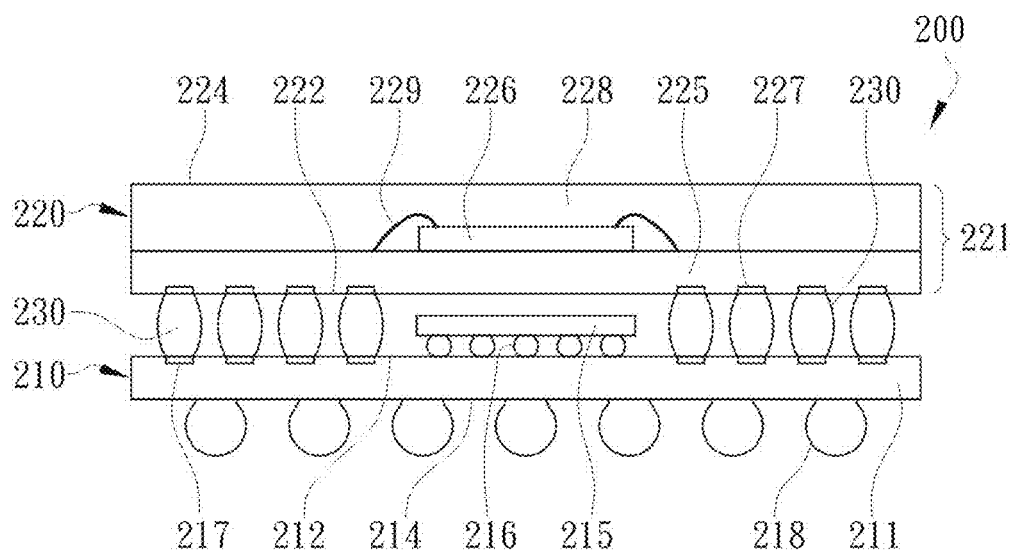

Finally, the stand-off mechanism 240 is removed to obtain a POP structure 200, as shown in FIG. 3E. In an embodiment of the present invention, the stand-off mechanism 240 may be removed by disassembling the support bracket. As shown in FIG. 4. Each of the interposer solder balls 230 is of a barrel shape and has a height A substantially equal to the minimum vertical gap H2. A cross sectional width C of each interposer solder ball 230 is less than a pitch B between two adjacent interposer solder balls 230. The height A of the interposer solder balls 230 may be ranged from 0.1 millimeter to 0.5 millimeter, and the pitch B between two adjacent interposer solder balls 230 may be ranged from 0.1 millimeter to 0.3 millimeter. In the embodiment, a side curvature of the interposer solder balls 230 is less than a side curvature of the first solder balls 213 and a side curvature of the second solder balls 223.

As shown in FIGS. 3E and 4, the POP structure 200 manufactured according to the foresaid method comprises a first semiconductor package 210, a second semiconductor package 220 and a plurality of interposer solder balls 230. The first semiconductor package 210 has a first body 211. The second semiconductor package 220 has a second body 221. The second semiconductor package 220 is disposed onto the first semiconductor package 210. The first solder balls 213 and the second solder balls 223 are soldered to form the interposer solder balls 230 to electrically connect the first body 211 and the second body 221. Each of the interposer solder balls 230 has a cross sectional width C less than the pitch B between two adjacent interposer solder balls 230. Each of the interposer solder balls 230 is of a barrel shape and has a height A substantially equal to the minimum vertical gap H2.

Accordingly, the present invention provides a method and a package-on-package (POP) structure for preventing bridging of interposer solder balls. A stand-off mechanism is utilized to maintain a minimum vertical gap between the bodies of semiconductor packages of the POP structure to form a fine pitch package with a high yield.

Figure 5A:
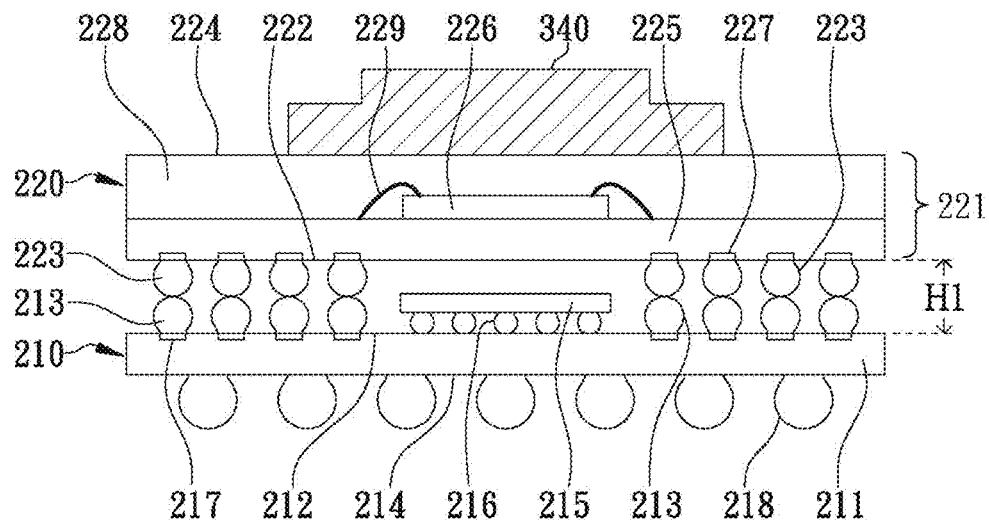
FIGS. 5A to 5B are cross-sectional views showing the first semiconductor package and the second semiconductor package before and after performing a reflow soldering process respectively according to a second embodiment of the present invention.
Figure 5B:
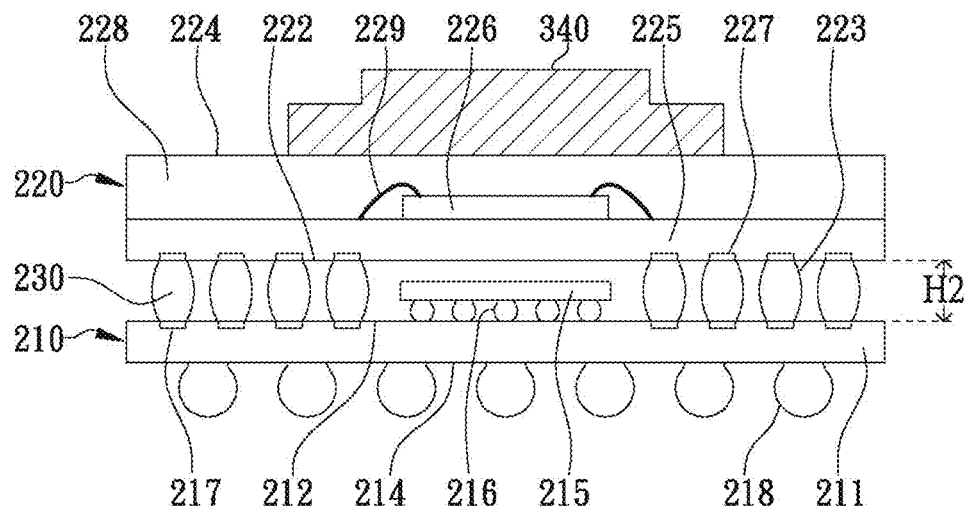

According to a second embodiment of the present invention, another method of POP stacking for preventing bridging of interposer solder balls is illustrated in FIGS. 5A to 5B for a cross-sectional view. FIGS. 5A to 5B are cross-sectional diagrams illustrating the first semiconductor package and the second semiconductor package before and after performing a reflow soldering process respectively according to the second embodiment. The same reference numbers used in the first embodiment and the second embodiment represent the same elements, and thus descriptions of the same elements will not be repeated hereinafter. The process steps of the second embodiment are roughly the same as those of the first embodiment, and the POP structure manufactured according to the second embodiment is the same as the POP structure 200 manufactured according to the first embodiment.

First, a first semiconductor package 210 is provided. The first semiconductor package 210 comprises a first body 211 and a plurality of first solder balls 213 formed on an upper surface 212 of the first body 211. In an embodiment of the present invention, the first body 211 may comprise a plurality of first solder pads 217, and the first solder balls 213 are longitudinally corresponding to the first solder pads 217 and formed on the first solder pads 217. Afterward, a second semiconductor package 220 is provided. The second semiconductor package 220 comprises a second body 221 and a plurality of second solder balls 223 formed on a bottom surface 222 of the second body 221. Subsequently, a pick-and-drop positioning process is performed to dispose the second semiconductor package 220 onto the first semiconductor package 210 so as to move the second solder balls 223 towards the first solder balls 213. When the second solder balls 223 contact the first solder balls 213, a vertical distance between the first body 211 and the second body 221 is equal to the vertical gap H1.

Then, a reflow soldering process is performed, as shown in FIG. 5B. During the reflow soldering process, the first solder balls 213 and the second solder balls 223 are heated, such that the first solder balls 213 and the second solder balls 223 are engaging with one another so as to solder the first solder balls 213 and the second solder balls 223 to form the interposer solder balls 230 to electrically connect the first body 211 with the second body 221. When the reflow soldering process is performed, a stand-off mechanism 340 is utilized to maintain the minimum vertical gap H2 between the first body 211 and the second body 221.

Finally, the stand-off mechanism 340 is removed. In the embodiment, the stand-off mechanism 340 comprises a suction head attached to an upper surface of the second body 221 to suspend the second body 221 above the first body 211. The suction head may be removed from the second body 221 by releasing the adhesion force of the suction head.

According to the embodiments of the present invention, a stand-off mechanism is utilized to maintain the minimum gap between the first body and the second body while the reflow soldering process is performed. Each of the interposer solder balls has a height substantially equal to the minimum gap and a cross sectional width less than the pitch between two adjacent interposer solder balls. Thereby, the POP structure would be a fine pitch package with a high yield, and bridges between the interposer solder balls could be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of package-on-package (POP) stacking comprising:
providing a first semiconductor package, the first semiconductor package having a first body, and a plurality of first solder balls disposed on an upper surface of the first body;
providing a second semiconductor package, the second semiconductor package having a second body, and a plurality of second solder balls disposed on a bottom surface of the second body;
performing a pick-and-drop positioning process, comprising disposing the second semiconductor package onto the first semiconductor package so as to move the second solder balls towards the first solder balls;
performing a reflow soldering process on the first body and the second body, the reflow soldering process comprising using a stand-off mechanism to control a minimum vertical gap between the first body and the second body and heating the first solder balls and the second solder balls to solder the first solder balls and the second solder balls to each other and form a plurality of interposer solder balls, each of the plurality of interposer solder balls having a height substantially equal to the minimum vertical gap and a cross sectional width less than a pitch between two adjacent interposer solder balls of the plurality of interposer solder balls; and
removing the stand-off mechanism after performing the reflow soldering process.

2. The method of claim 1, wherein the second body comprises a mold and a second die encapsulated in the mold.

3. The method of claim 1, wherein the stand-off mechanism comprises a support bracket disposed between an edge portion of the upper surface of the first body and an edge portion of the bottom surface of the second body.

4. The method of claim 3 further comprising:
removing the support bracket after performing the reflow soldering process.

5. The method of claim 1, wherein the stand-off mechanism comprises a suction head attached to an upper surface of the second body to suspend the second body above the first body.

6. The method of claim 5 further comprising:
removing the suction head after performing the reflow soldering process.

7. The method of claim 1, wherein the first semiconductor package is a flip-chip package, the first body comprises a first substrate, and a first die of the first semiconductor package is bonded on the upper surface of the first body.

8. The method of claim 7, wherein the second body comprises a mold and a second die encapsulated in the mold.

9. The method of claim 7, wherein a side curvature of the interposer solder balls is less than a side curvature of the first solder balls and a side curvature of the second solder balls.

10. The method of claim 1, wherein the height is greater than the cross sectional width.

11. The method of claim 1, wherein each interposer solder ball is of a barrel shape.

12. A package-on-package (POP) structure comprising:
a first semiconductor package having a first body;

a second semiconductor package having a second body, wherein the second semiconductor package is disposed on the first semiconductor package; and a plurality of interposer solder balls formed between the first body and the second body, each of the interposer solder balls having a cross sectional width less than a pitch between two adjacent interposer solder balls of the plurality of interposer solder balls, a height of each interposer solder ball is greater than the cross sectional width.

13. The POP structure of claim 12, wherein the second body comprises a mold and a second die encapsulated in the mold.

14. The POP structure of claim 13, wherein the second body further comprises a second substrate, and the mold is formed on the second substrate.

15. The POP structure of claim 12, wherein the first semiconductor package is a flip-chip package, the first body comprises a first substrate, and a first die of the first semiconductor package is bonded on an upper surface of the first body.

16. The POP structure of claim 15, wherein the second body comprises a mold and a second die encapsulated in the mold.

17. The POP structure of claim 16, wherein the second body further comprises a second substrate, and the mold is formed on the second substrate.

18. The POP structure of claim 12, wherein each interposer solder ball is of a barrel shape.

* * * * *